(12) United States Patent
Jones et al.

(10) Patent No.: US 11,313,237 B2
(45) Date of Patent: Apr. 26, 2022

(54) CONFORMING COATING MASK FOR A COMPONENT AND SYSTEM BACKGROUND

(71) Applicant: General Electric Company, Schenectady, NY (US)

(72) Inventors: Jeffrey Clarence Jones, Simpsonville, SC (US); Zachary John Snider, Simpsonville, SC (US); Christopher Donald Porter, Greenville, SC (US); Brad Wilson VanTassel, Greer, SC (US)

(73) Assignee: General Electric Company, Schenectady, NY (US)

( * ) Notice: Subject to any disclaimer, the term of this patent is extended or adjusted under 35 U.S.C. 154(b) by 153 days.

(21) Appl. No.: 16/870,234

(22) Filed: May 8, 2020

(65) Prior Publication Data

US 2021/0348513 A1 Nov. 11, 2021

(51) Int. Cl.
| | |
|---|---|
| *B05B 12/26* | (2018.01) |
| *B05C 21/00* | (2006.01) |
| *F01D 5/18* | (2006.01) |
| *B33Y 80/00* | (2015.01) |
| *B05C 3/20* | (2006.01) |
| *B05D 1/32* | (2006.01) |
| *C23C 14/04* | (2006.01) |

(52) U.S. Cl.
CPC .............. *F01D 5/186* (2013.01); *B05B 12/26* (2018.02); *B05C 3/20* (2013.01); *B05C 21/005* (2013.01); *B05D 1/32* (2013.01); *B33Y 80/00* (2014.12); *C23C 14/042* (2013.01); *F05D 2230/31* (2013.01); *F05D 2240/30* (2013.01); *F05D 2260/202* (2013.01)

(58) Field of Classification Search
USPC ......... 118/504, 505, 721, 301; 416/62, 97 R, 416/214 R; 415/180, 191, 200
See application file for complete search history.

(56) References Cited

U.S. PATENT DOCUMENTS 5,985,122 A * 11/1999 Conner ................. C25D 5/022
205/135
6,109,873 A 8/2000 Brooks et al.
(Continued)

FOREIGN PATENT DOCUMENTS

| EP | 1734226 A1 | 12/2006 |
|---|---|---|
| EP | 2617861 A1 | 7/2013 |
| EP | 3309136 A1 | 4/2018 |

OTHER PUBLICATIONS

European Search Report and Opinion issued in connection with corresponding EP Application No. 21171351.6, dated Sep. 29, 2021, 5 pages.

*Primary Examiner* — Yewebdar T Tadesse
(74) *Attorney, Agent, or Firm* — James Pemrick; Hoffman Warnick LLC

(57) ABSTRACT

A conforming coating mask is used with a turbine component having a plurality of cooling holes. The conforming coating mask includes at least two anchors; a plurality of radial mask strips integrally formed with and extending between each of the at least two anchors; and at least one coating mask securing insert. Each at least one coating mask securing insert integrally formed with a respective at least one radial mask strip; wherein the plurality of radial mask strips align with and cover the plurality of cooling holes.

20 Claims, 4 Drawing Sheets

(56) References Cited

U.S. PATENT DOCUMENTS

2010/0255200 A1 10/2010 Kaya et al.
2018/0281006 A1 10/2018 Coskun et al.
2019/0101004 A1 4/2019 Rudolph

* cited by examiner

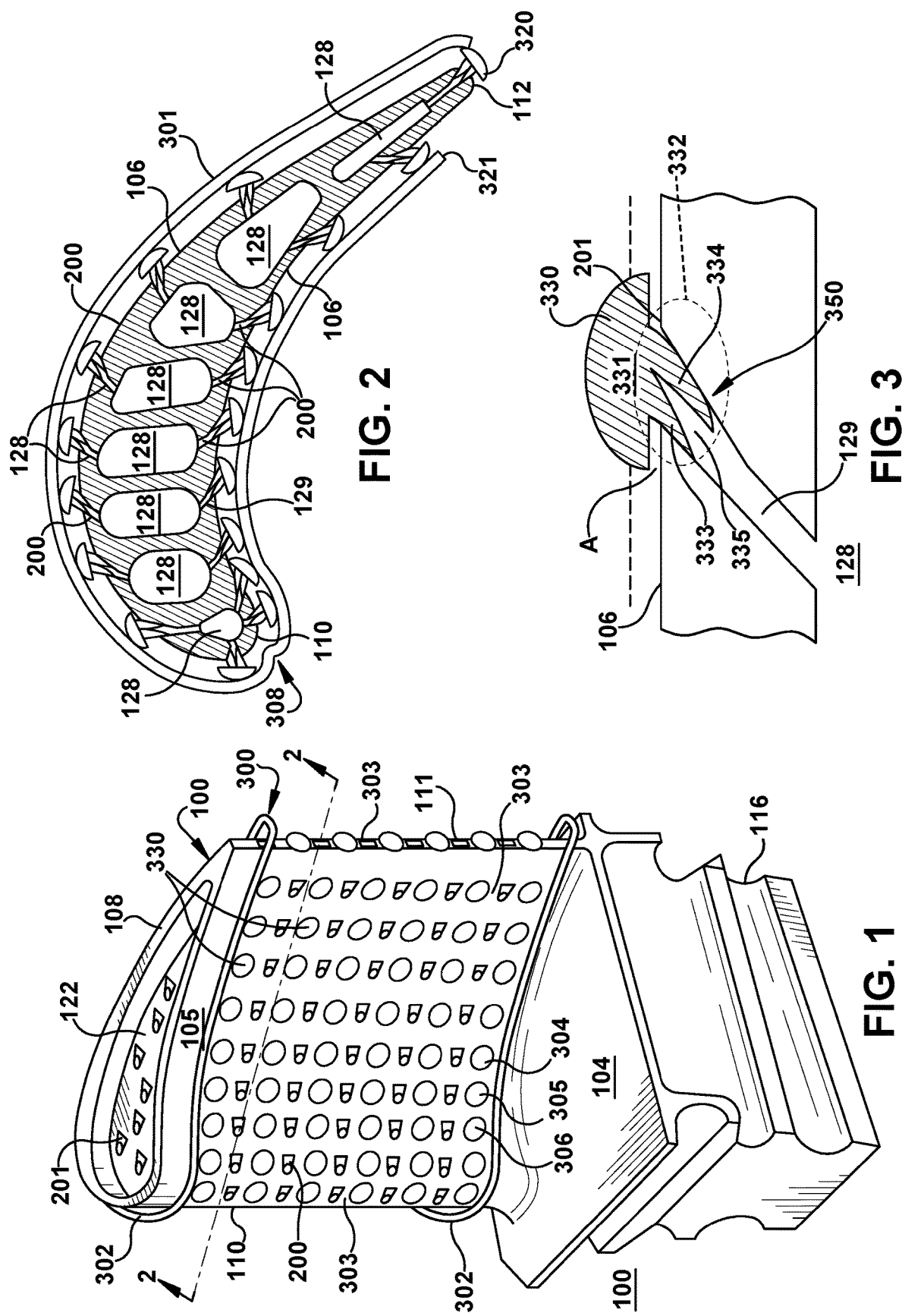

CONFORMING COATING MASK FOR A COMPONENT AND SYSTEM BACKGROUND

BACKGROUND

The disclosure relates generally to a system including a coating mask contemporaneously formed with a component. In particular, the disclosure relates to a system including a conforming coating mask contemporaneously formed via additive manufacturing with a turbine blade component.

BRIEF DESCRIPTION

A first aspect of the disclosure provides a conforming coating mask used with a turbine component having a plurality of cooling holes. The conforming coating mask includes at least two anchors; a plurality of radial mask strips integrally formed with and extending between each of the at least two anchors; and at least one coating. Each at least one coating mask securing insert integrally formed with a respective at least one radial mask strip; wherein the plurality of radial mask strips align with and cover the plurality of cooling holes.

A second aspect of the disclosure provides a system including a turbine component and a conforming coating mask contemporaneously formed with the component. The turbine component includes an airfoil and a plurality of cooling holes therein. The conforming coating mask includes: includes at least two anchors; a plurality of radial mask strips integrally formed with and extending between each of the at least two anchors; and at least one coating mask securing insert. Each at least one coating mask securing insert integrally formed with a respective at least one radial mask strip; wherein the plurality of radial mask strips align with and cover the plurality of cooling holes.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a schematic perspective view of a blade with conforming coating mask according to embodiments of the disclosure;

FIG. 2 shows a cross-section view from line 2-2 of FIG. 1 of a blade with conforming coating mask according to embodiments of the disclosure;

FIG. 3 shows a side sectional view of a coating mask securing insert in a blade cooling hole according to embodiments of the disclosure;

Figure 4:
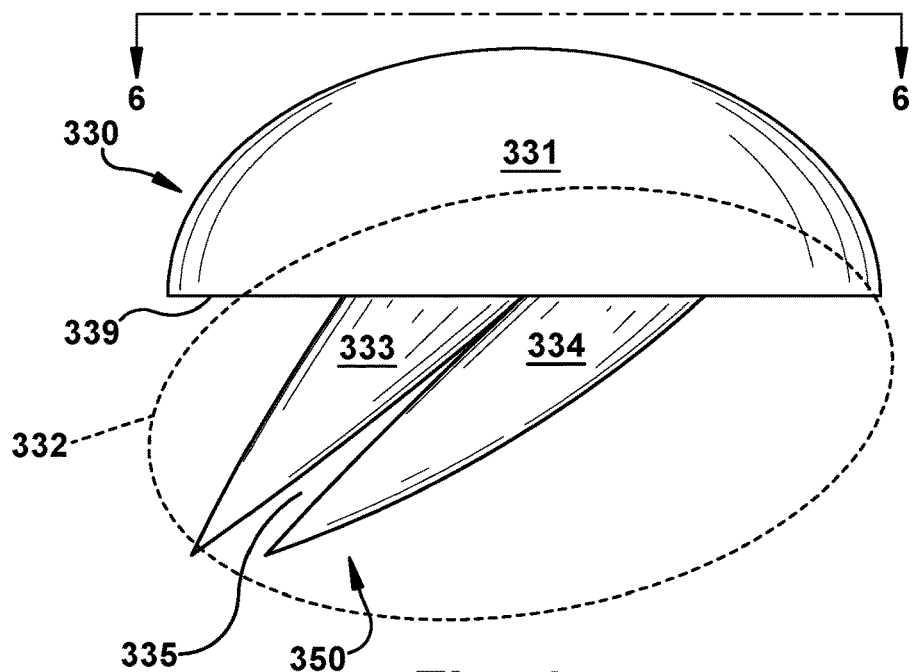
FIG. 4 shows a side sectional view of a coating mask securing insert according to embodiments of the disclosure.
Figure 5:
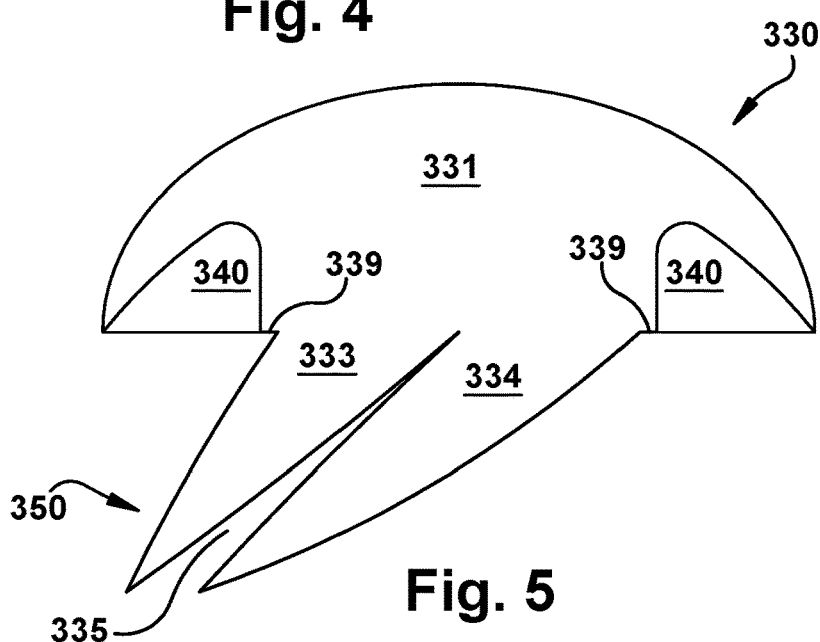
FIG. 5 shows a side sectional view of a coating mask securing insert according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

As an initial matter, in order to clearly describe the current technology, it will become necessary to select certain terminology when referring to and describing conforming coating masks contemporaneously formed via additive manufacturing with a turbine blade or other turbine component (hereinafter referred to as "turbine blade" or "blade" for ease of reference) with cooling holes. These conforming coating mask systems provide the turbine blade having cooling holes protection during any post turbine blade formation processing, such as but not limited to coating. To the extent possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

In addition, several descriptive terms may be used regularly herein, and it should prove helpful to define these terms at the onset of this section. These terms and their definitions, unless stated otherwise, are as follows. As used herein, "downstream" and "upstream" are terms that indicate a direction relative to the flow of a fluid, such as the working fluid through the turbine engine or, for example, the flow of air through the combustor or coolant through one of the turbine's component systems. The term "downstream" corresponds to the direction of flow of the fluid, and the term "upstream" refers to the direction opposite to the flow. The terms "forward" and "aft," without any further specificity, refer to directions, with "forward" referring to the front or compressor end of the engine, and "aft" referring to the rearward or turbine end of the engine.

It is often required to describe parts that are disposed at differing radial positions with regard to a center axis. The term "radial" refers to movement or position perpendicular to an axis. For example, if a first component resides closer to the axis than a second component, it will be stated herein that the first component is "radially inward" or "inboard" of the second component. If, on the other hand, the first component resides further from the axis than the second component, it may be stated herein that the first component is "radially outward" or "outboard" of the second component. The term "axial" refers to movement or position parallel to an axis. Finally, the term "circumferential" refers to movement or position around an axis. It will be appreciated that such terms may be applied in relation to the center axis of the turbine.

In addition, several descriptive terms may be used regularly herein, as described below. The terms "first", "second", and "third" may be used interchangeably to distinguish one component from another and are not intended to signify location or importance of the individual components.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Where an element or layer is referred to as being "on," "engaged to," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

To facilitate understanding of embodiments of the disclosure, it is known that the pace of change and improvement in the realms of power generation, aviation, and other fields has accompanied extensive research for manufacturing components used in these fields. Conventional manufacture of metallic, plastic or ceramic composite components generally includes milling or cutting away regions from a slab of material before treating and modifying the cut material to yield a part, which may have been simulated using computer models, e.g., in drafting software. Manufactured components which may be formed from metal can include, e.g., airfoil components for installation in a turbomachine such as an aircraft engine or power generation system.

Additive manufacturing (AM) includes a wide variety of processes of producing a component through the successive layering of material rather than the removal of material. As such, additive manufacturing can create complex geometries without the use of any sort of tools, molds or fixtures, and with little or no waste material. Instead of machining components from solid billets of material, much of which is cut away and discarded, the only material used in additive manufacturing is what is required to shape the component.

Additive manufacturing techniques typically include taking a three-dimensional computer aided design (CAD) file of the component to be formed, electronically slicing the component into layers, e.g., 18-102 micrometers thick, and creating a file with a two-dimensional image of each layer, including vectors, images or coordinates. The file may then be loaded into a preparation software system that interprets the file such that the component can be built by different types of additive manufacturing systems. In 3D printing, rapid prototyping (RP), and direct digital manufacturing (DDM) forms of additive manufacturing, material layers are selectively dispensed, sintered, formed, deposited, etc., to create the component.

In metal powder additive manufacturing techniques, such as direct metal laser melting (DMLM) (also referred to as selective laser melting (SLM)), metal powder layers are sequentially melted together to form the component. More specifically, fine metal powder layers are sequentially melted after being uniformly distributed using an applicator on a metal powder bed. Each applicator includes an applicator element in the form of a lip, brush, blade or roller made of metal, plastic, ceramic, carbon fibers or rubber that spreads the metal powder evenly over the build platform. The metal powder bed can be moved in a vertical axis. The process takes place in a processing chamber having a precisely controlled atmosphere. Once each layer is created, each two dimensional slice of the component geometry can be fused by selectively melting the metal powder. The melting may be performed by a high powered melting beam, such as a 100 Watt ytterbium laser, to fully weld (melt) the metal powder to form a solid metal. The melting beam moves in the X-Y direction using scanning mirrors, and has an intensity sufficient to fully weld (melt) the metal powder to form a solid metal. The metal powder bed may be lowered for each subsequent two dimensional layer, and the process repeats until the component is completely formed.

Further, turbine components, such as but not limited to airfoils, turbine blades, and vanes (nozzles) of gas turbine engine often require a complex cooling scheme in which cooling air flows through the airfoil and is then discharged through carefully configured cooling holes. For example, but merely illustrative of the disclosure, a component's cooling holes may include cooling holes at a trailing edge of the airfoil. Turbine blade performance is related to the ability to provide uniform cooling of airfoil surfaces. Consequently, the control of cooling hole size and shape is important in turbine airfoil designs because size and shapes of the opening may determine flow amounts exiting a given hole, hole distribution across the airfoil, and overall flow distribution within the cooling circuit. Other factors, such as backflow margin, are also affected by variations in opening size. Thus protecting cooling holes' intended configuration, including after post component processing, such as coating, will enable cooling holes to fulfill their expected function.

In addition to conventional hole drilling techniques, such as laser machining and electrical-discharge machining (EDM), complex advanced casting practices may be used to yield airfoils with dimensionally correct cooling hole openings in order to repeatably control opening size. Once cast, subsequent airfoil manufacturing operations must be performed such that cast-to-size cooling hole openings are not processed through operations that would alter the dimensions of some or all of the cooling hole openings.

However, with increasingly complex air passage criteria for some turbines, additive manufacturing processes (as discussed above) have been employed to form turbine components. Additive manufacturing processes enable formation of intricate, serpentine, and complex cooling passages and cooling hole openings, in manners easier, more efficient, and less costly than some traditional formation methods.

Regardless of how formed, with increasingly severe operating environments of turbine components, protective coatings are typically applied to turbine components when manufactured and possibly also during repair. Modern high efficiency combustion turbines have firing temperatures that exceed about 1,000 degree C., and even higher firing temperatures are expected as the demand for more efficient engines continues. Many components that form the "hot gas path" combustor and turbine sections are directly exposed to aggressive hot combustion gasses, for example, the combustor liner, the transition duct between the combustion and turbine sections, and the turbine stationary vanes and rotating blades and surrounding ring segments. In addition to thermal stresses, these and other components are also exposed to mechanical stresses and loads that further wear on the components.

Many iron-, cobalt-, and nickel-based superalloy materials traditionally used to fabricate the majority of combustion turbine components used in the hot gas path section of the combustion turbine engine are insulated from the hot gas flow by coating the components with protective coatings in order to survive long term operation in this aggressive high temperature combustion environment. Protective coatings include, but are not limited to, thermal barrier coatings (TBC), bond coats, environmental barrier coatings (EBC), combinations thereof, and other coatings now known or hereinafter developed. Protective coatings can be produced by a multi-step process that includes coating surfaces requiring a protective coating for example with a bond coat and subsequent additional coats, dependent on the intended use of the turbine component and the environment associated with the use.

TBCs are highly advanced material systems. These coatings serve as protective coatings to insulate the components from large and prolonged heat loads by utilizing thermally insulating materials, which can sustain an appreciable temperature difference between the load bearing alloys and the coating surface. In doing so, these coatings can allow for higher operating temperatures while limiting the thermal exposure of structural components, extending component life by reducing oxidation and thermal fatigue.

TBCs are applied by various methods to a turbine component. Spraying is often used to apply a TBC (or other coating). Illustrative spray application processes include, but are not limited to, plasma spraying both in air and vacuum, cold spraying, electrostatic spraying, electron beam physical vapor disposition, chemical vapor deposition, thermal spraying, high-velocity oxy-fuel coating, physical vapor disposition, combinations thereof, and other spraying techniques now known or hereinafter developed.

With reference to FIG. 1, a turbine blade 100 includes an airfoil 105 and a base 116. Base 116 includes a platform 104 to which airfoil 105 is attached. Airfoil 105 has a tip 108 defining a recess 122 therein. Airfoil 105 further includes a leading edge 110 and a trailing edge 111.

As discussed above, cooling holes are often needed in gas turbine engine components. Cooling holes often require a complex cooling scheme in which cooling air flows through the airfoil and is then discharged through carefully configured cooling holes. In FIGS. 1 and 2, a complex cooling scheme includes cooling passages 128 (FIG. 2) leading to tip cooling holes 201 in tip 108. Complex cooling scheme further includes airfoil cooling holes 200 connected via connecting tubes 129 to cooling passages 128 (FIG. 2). Cooling holes 200 are often provided in columns from platform 104 to tip 108 on airfoil 105 aligning with cooling passages 128.

One aspect of spray coating a turbine component, such as a blade 100, according embodiments of the disclosure, surrounds control, or lack thereof, of the spray around the cooling holes 200, 201 of blade 100. Control of spray herein means that spray avoids bridging around cooling holes 200, 201 and subsequent need for rework. Of course, any coating or other post processing/formation component processing must not prevent the airfoil from meeting operational requirements, including cooling air airflow requirements through the airfoil and exiting through cooling holes at the airfoil surface.

One post processing/formation coating outcome that should be avoided is "bridging," which is a buildup of coating between the coated surface and the edge of the coating mask—thus bridging the gap. The coating mask is intended to keep the coating out of the cooling hole and excessive bridging prevents the mask from being readily removed from the coated part. The coating mask must be spaced far enough from the surface to prevent bridging yet close enough to the surface to keep coating material out of the cooling hole. Of course, for maintaining the expected function of the cooling holes, bridging should controlled.

As will be discussed in detail hereinafter, bridging is due to the "shadowing" effect of spray (for example but not intended to limit the embodiments, TBC) as it deposits on the component, here blade 100. The shadowing effect may be best visualized by placing an object in front of a light source and observing the shadow cast by that object. Light rays passing around the object is representative of spray being deposited, while the shadow cast by the object is representative of a void in the deposited spray. However, holes (such as cooling holes 200, 201) that are too small or too close to each other can create a bridge as coating can build upon itself "bridge" over the holes, in a natural process called shadowing. At these holes, coating can block holes. In addition, coating material may not be rigorously bonded or adhered to the component or substrate. Thus, re-work may be needed to clear the holes 200, 201 of the "bridge" (when the coating is built up over the targeted area and hole) or re-coat at locations (where coating is not rigorously bonded or adhered to the component or substrate), which may prolong processing time, require further resources, and may cause lost opportunity costs, and the like.

As embodied by the disclosure, a conforming coating mask formed contemporaneously with a turbine component, e.g., blade 100, is provided to mitigate, and in some cases avoid bridging and other undesirable effects of post formation processing such as but not limited to coating. As illustrated in FIGS. 1 and 2, a conforming coating mask 300 is contemporaneously formed with blade 100 via additive manufacturing. Accordingly, conforming coating mask 300 can conform its configuration to the shape, contour, and tolerances of blade 100. As illustrated, conforming coating mask 300 wraps around and encircles at least part of blade 100 and aligns with the contour where conforming coating mask 300 encircles airfoil 105.

Conforming coating mask 300 includes self-biasing anchors 301, 302. Anchors 301, 302 are preferably positioned near tip 108 and platform 104 of the blade 100. Anchors 301, 302 are formed flexibly for wrapping around and encircling airfoil 105. Anchors 301, 302 are formed with ends 320 and 321 that can be located at various locations around airfoil 105. Anchors 301, 302 may start with an end 320, 321 at any location on airfoil 105, and in FIG. 1 end 320 is at trailing edge 111 where an initial coating mask securing insert 330 is configured to be inserted into a corresponding cooling hole 200 (as described herein). Anchors 301, 302 can wrap around and encircle airfoil 105 so end 321 terminates on airfoil 105, often to a position where anchors 301, 302 almost totally encircle airfoil 105. A terminus coating mask securing insert 330 is configured to be inserted into a corresponding cooling hole 200 (as also described hereinafter) to secure end plug cap 331 onto airfoil 105.

Anchors 301, 302 can include a hinge structure 308 (FIG. 2) formed by additive manufacturing. Hinge structure 308 enables and facilitates installation of conforming coating mask 300 on blade 100. Hinge structure 308 enables anchors 301, 302 to be positioned around bends and other intricate surface profile regions on blade 100.

Moreover, it is desirable, but not necessary, that anchors 301, 302 extend around airfoil 105 to correspond to areas of airfoil 105 where cooling holes 200 are positioned. Thus, as described hereinafter, conforming coating mask 300 includes radial mask strips 303 provided with coating mask securing inserts 330. Radial mask strips 303 extend between anchors 301, 302 and extend the overall height of airfoil 105. Formation of anchors 301, 302 and radial mask strips 303 during additive manufacturing in alignment with airfoil cooling holes 200 will position coating mask securing inserts 330 aligned with cooling holes 200 for masking those cooling holes 200, as described herein.

Radial mask strips 303 generally align with columns of cooling holes 200, and include at least one, and preferably a plurality of, coating mask securing inserts 330. Coating mask securing inserts 330 are contemporaneously additively manufactured with plug strips 303, and anchors 301, 302. Thus, as explained herein, coating mask securing inserts 330 align with cooling holes 200.

As illustrated in FIGS. 1 and 3, coating mask securing inserts 330 on radial mask strips 303 are configured to be aligned with cooling holes 200 on the airfoil 205. In a non-limiting aspect of the disclosure, all cooling holes 200 have a corresponding coating mask securing insert 330. Other non-limiting aspects of the disclosure include, coating mask securing inserts 330 on radial mask strips 303 for only one cooling hole 200 of a column (radial mask strip 306), coating mask securing inserts 330 on radial mask strips 303 for a plurality of cooling holes 200 of a column (radial mask strip 305), or coating mask securing inserts 330 on radial mask strips 303 for every cooling hole 200 of a column (radial mask strip 304) on airfoil 205.

Radial mask strips 303 are configured to extend over the entire length of airfoil 105 from tip 108 to platform 104. Alternately, radial mask strips 303 are configured to extend over a partial portion of the entire length of airfoil 105, such as extending from tip 108 but terminating before platform 104, initiated down from tip 108 and terminating at platform 104, or initiated down from tip 108 and but terminating before platform 104.

Coating mask securing inserts 330 are integrally formed with each radial mask strip radial mask strips 303 during additive manufacturing and are configured to overlie and correspond to cooling holes 200. Coating mask securing inserts 330 assist in alignment and securing of radial mask strips 303 in place. Alignment and securing of radial mask strips 303 in cooling holes 200 by coating mask securing inserts 330 can be achieved by an insertion part 350 of at least one coating mask securing insert 330 of each radial mask strips 303 entering cooling holes 200.

In certain instances, insertion part 350 is configured to simply fit within cooling hole 200 to align and secure in place radial mask strips 303. In other embodiments of the application, insertion part 350 is configured to fit within cooling hole 200 to frictionally engage a portion of cooling hole 200 to align and secure in place radial mask strips radial mask strips 303.

In a non-limiting aspect of the embodiments, as illustrated in FIG. 3, insertion part 350 of radial mask strips 303 is formed with a compressible portion 332 that is configured to be disposed within cooling holes 200, 201 when conforming coating mask 300 is used to mask blade 100. The contemporaneous additive manufacturing of conforming coating mask 300 and blade 100 permits conforming coating mask 300 to conform and match surface 106 of blade 100. Whereas additively manufactured elements, here blade 100, include unique contour and tolerances, contemporaneously additively manufacturing conforming coating mask 300 that is configured to conform with blade 100, permits a desired alignment of coating mask securing inserts 330 with cooling holes 200, 201 on the airfoil 105.

Figure 6:
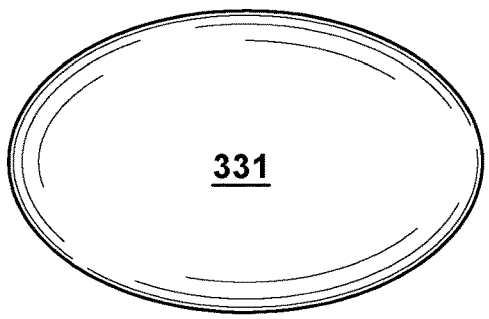
FIG. 6 shows a top perspective view of a coating mask securing insert taken from line 6-6 in FIG. 4 according to embodiments of the disclosure.
Figure 7:
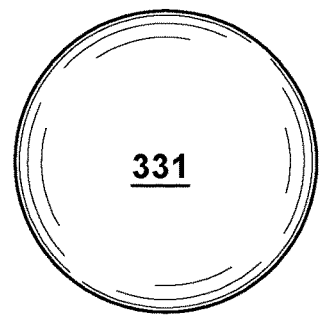
FIG. 7 shows a top perspective view of a coating mask securing insert taken from line 6-6 in FIG. 4 according to embodiments of the disclosure.

Coating mask securing inserts 330 include a plug cap 331 (FIG. 3). Plug cap 331 has a raised top portion and is complementary in peripheral configuration to the respective cooling hole 200 it is additively manufactured to mask. Peripheral configurations of plug cap plug cap 331 can be an elliptical periphery (FIG. 6), a circular periphery (FIG. 7), or any other cooling hole complementary peripheral configuration, known now or hereinafter developed. The periphery of plug cap 331 regardless of the shape of plug cap 331 periphery is configured to extend over the entirety of each corresponding cooling hole 200 that each coating mask securing insert 330 is aligned with and positionable over. Elliptical periphery (FIG. 6) is configured to useful for cooling holes 200 at especially curved surface portions of airfoil 105, such as but not limited to leading edge 110 and trailing edge 111. Circular periphery (FIG. 7) is configured to be useful at cooling holes 200 that are positioned at intermediate locations on airfoil 105. Furthermore, embodiments of the disclosure are intended to include any configuration of plug cap 331 that overlies cooling holes.

Compressible portion 332 of coating mask securing insert 330 is formed on the bottom surface 339 of coating mask securing inserts 330. Compressible portion 332 enables insertion and installation of coating mask securing inserts 330 into cooling holes 200. Compressible portion 332 of coating mask securing inserts 330 is resilient enough to be compressed as coating mask securing inserts 330 enter cooling holes 200. Compressible portion 332 contacts walls of cooling holes 200, compressing compressible portion 332. Thereafter, compressible portion 332 will frictionally secure the coating mask securing inserts 330 in cooling hole 200.

Compressible portion 332 of coating mask securing inserts 330 includes two compressible legs 333, 334 (for ease of description compressible legs 333, 334 will be referred to as "legs 333, 334"). Legs 333, 334 are integrally formed during additive manufacturing with plug cap 331, the radial mask strips 303, and conforming coating mask 300. Legs 333, 334 are formed to fit in cooling holes 200. The resiliency of legs 333, 334 enable coating mask securing inserts 330 to have a force asserted against them to compress legs 333, 334 towards each other in a gap 335. When in a cooling hole 200, legs 333, 334 can un-compress to frictionally engage walls of cooling hole 200 and retain the coating mask securing inserts 330 therein. Accordingly, legs 333, 334 frictionally retain conforming coating mask 300 in cooling holes 200 with blade 100.

Moreover, legs 333, 334 can be envisioned as a split conical structure. A cone formed with its base on bottom 339 and formed essentially "split" in half from apex to base. Each half from its apex is additively manufactured in a "split" or spaced structure or formed set apart from each other while the base portions remain intact on the bottom surface 339 of coating mask securing inserts 330. Thus, apexes are configured to form a v-shaped gap 335, which is triangular in cross-section, as discussed herein.

As illustrated in FIGS. 3-5, 8, and 9, v-shaped gap 335 is configured to permit coating mask securing inserts 330 to have legs 333, 334 compressed when inserted into cooling holes 200 (as described herein). Compression of legs 333, 334 may be by an appropriate external force, for example but in no way limiting of the disclosure, an individual's fingers, putting pressure on legs 333, 334 to move legs 333, 334 towards each other and decrease v-shaped gap 335 size, so coating mask securing inserts 330 can be inserted into cooling holes 200. Alternatively, legs 333, 334 abutting against cooling hole 200 inner surfaces (see FIG. 3) when conforming coating mask 300 is attached to blade 100, as described herein) will cause legs 333, 334 to be moved towards each other and compressed. In each of the above situations, legs 333, 334 of coating mask securing inserts 330 can un-compress (at least to an extent) to frictionally hold coating mask securing inserts 330 in cooling holes 200.

While legs 333, 334 are illustrated as generally conical in configuration, that is merely illustrative of multiple configurations possible for legs 333, 334. Of course, compression of legs 333, 334 against cooling hole 200 will be smoother if legs 333, 334 have complementary and corresponding engaging surfaces. Configurations of legs 333, 334 can be any shape, cross-section, and/or length to coincide and align with cooling holes 200. Accordingly, aspects of the disclosure include legs 333, 334 of any construction that enables legs 333, 334 to be compressible into cooling holes 200 and spring back to frictionally hold coating mask securing inserts 330 in cooling holes 200.

As seen in FIG. 3, each coating mask securing insert 330 overlies surface 106 of airfoil 105. The overlying orientation and structure of plug cap 331 occurs with contemporaneous additive manufacturing of plug cap 331 and radial mask strips 303. The contemporaneous formation of conforming coating mask 300 and component, here blade 100, permits conforming coating mask 300 to match surface tolerances of blade 100, as noted above, and permits alignment of coating mask securing inserts 330 with cooling holes 200 of airfoil 105.

Figure 10:
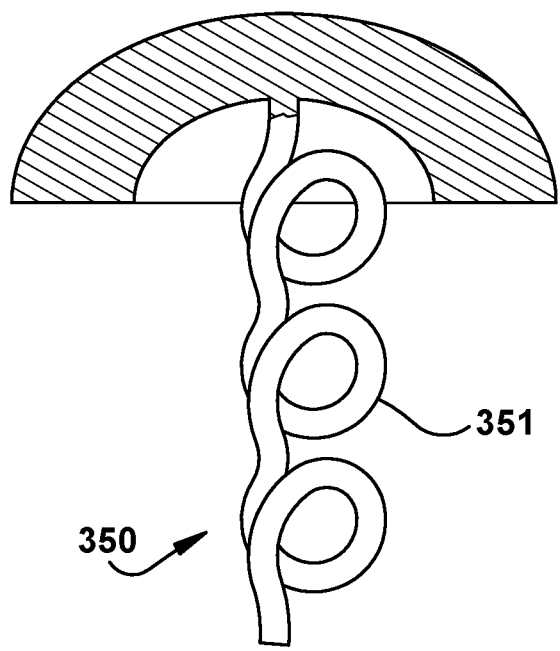
FIG. 10 shows a further aspect of a coating mask securing insert for cooling hole according to embodiments of the disclosure.
Figure 11:
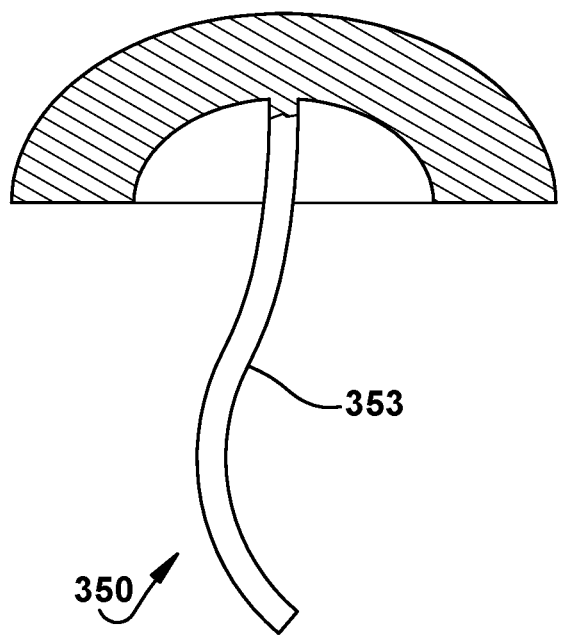
FIG. 11 shows yet another aspect of a coating mask securing insert according to embodiments of the disclosure.

FIGS. 10 and 11 illustrate further embodiments of insertion part 350 of at least one coating mask securing insert 330. FIG. 10 sets forth insertion part 350 in the form of an elongated spiral or cork-screw portion 351. Elongated spiral or cork-screw portion 351 is configured to extend into cooling holes 200, 201 with or without engaging sides walls of cooling holes 200, 201. Thus, elongated spiral or cork-screw portion 351 is configured to extend into cooling holes 200, 201 either frictionally engaging with cooling holes 200, 201 or without engaging cooling holes 200, 201, simply positioning elongated spiral or cork-screw portion 351 of coating mask securing insert 330 and radial mask strips 303 thereon.

FIG. 11 illustrates forth insertion part 350 in the form of a sinusoidal portion 353. Sinusoidal portion 353 is configured to extend into cooling holes 200, 201 with or without engaging sides walls of cooling holes 200, 201. Thus, sinusoidal portion 353 is configured to extend into cooling holes 200, 201 either frictionally engaging with cooling holes 200, 201 or without engaging cooling holes 200, 201, simply positioning sinusoidal portion 353 of coating mask securing insert 330 and radial mask strips 303 thereon.

For each insertion part 350, either elongated spiral or cork-screw portion 351 or sinusoidal portion 353 of coating mask securing insert 330 and radial mask strips radial mask strips 303, can be used with any configuration of plug cap 331, as embodied herein may be used. Moreover, plug cap 331 with may either elongated spiral or cork-screw portion 351 or sinusoidal portion 353 or may not be provided with depression 340, as described herein.

The additive manufacturing process forms coating mask securing inserts 330 with a configuration that when insertion part 350 of coating mask securing inserts 330 is inserted into cooling holes 200, bottom surface 339 of coating mask securing inserts 330 overlies surface 106 a distance A at cooling hole 200 (FIG. 4). Distance A is sufficient to exclude coating to enter under plug cap 331 to surface 106. Thus, coating does not enter under plug cap 331 and will not bridge cooling holes 200. By purposefully and advantageously setting distance A, thusly eliminating coating amounts under plug cap 331, conforming coating mask 300 prevents coating material around cooling holes 200 and prevents bridging between cooling holes 200.

Figure 8:
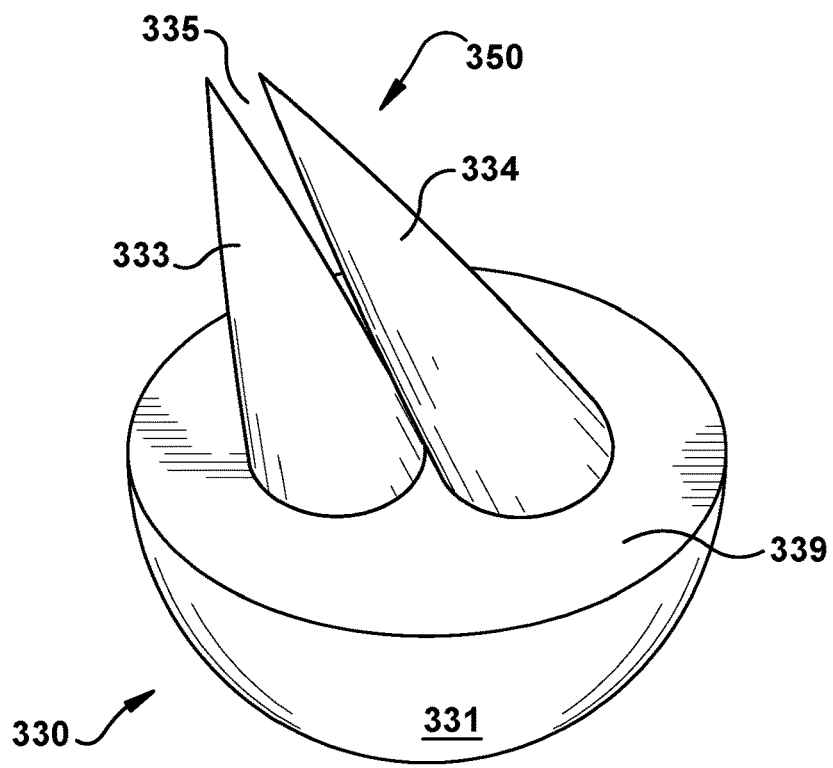
FIG. 8 shows a bottom perspective view of a coating mask securing insert according to embodiments of the disclosure.
Figure 9:
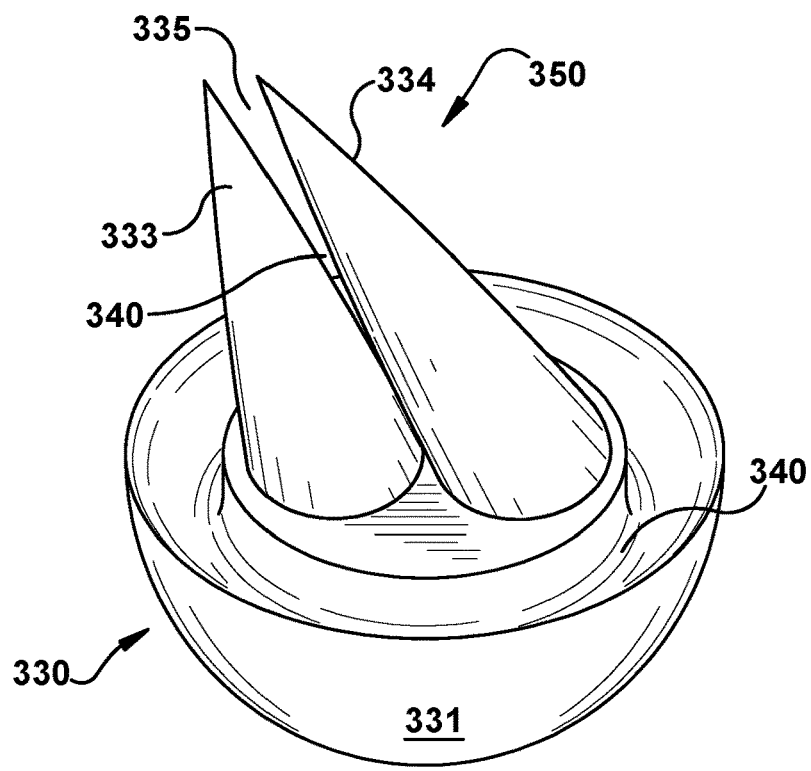
FIG. 9 shows a bottom perspective view of a coating mask securing insert according to embodiments of the disclosure.

With reference to FIGS. 8 and 9, in some aspects of the disclosure, bottom surface 339 of plug cap 331 is flat and can be formed via additive manufacturing extending from legs 333, 334. According to another aspect of the disclosure, plug cap 331 includes bottom surface 339 with a depression 340 (FIG. 5) formed extending from bottom surface 339 towards a top of plug cap 331. Depression 340 reduces amounts of materials needed to form conforming coating mask 300, insertion part 350, radial mask strips 303, and coating mask securing inserts 330. Depression 340 also can enhance any manipulation of coating mask securing inserts 330 as coating mask securing inserts 330 will be lighter, thus easier to move as needed into and out of cooling holes 200.

Once blade 100, and conforming coating mask 300 have been contemporaneously printed via additive manufacturing, conforming coating mask 300 can be aligned with blade 100 to be frictionally engaged therewith. Accordingly, due to contemporaneous formation, conforming coating mask 300 and its features match surface tolerances and contour of blade 100.

With reference to FIG. 1, to attach conforming coating mask 300 to blade 100, anchors 301, 302 are positioned so end 320 and a first initial radial mask strip 303 are aligned with a column of cooling holes 200. Thus, conforming coating mask 300 can be secured by entering or frictionally engaging at least one insertion part 350 of a respective coating mask securing insert 330 in a corresponding cooling hole 200. Thereafter, anchors 310, 302 are moved to encircle airfoil 105 and coating mask securing inserts 330 on each respective radial mask strip 303 can be aligned with and inserted into respective cooling holes until last terminal radial mask strip 303 associated with end 322 can be aligned with cooling holes 200, and insertion part 350 of respective coating mask securing inserts 330 at end 322 are inserted into cooling holes 200.

Alternatively, a further method for attaching conforming coating mask 300 to blade 100 positions anchors 301, 302 so end 320 and a first initial radial mask strip 303 are aligned with a column of cooling holes 200. Thus, conforming coating mask 300 can be secured by frictionally engaging insertion part 350 of at least one coating mask securing insert 330 in a corresponding cooling hole 200 at that first initial radial mask strip 303. Thereafter, anchors 310, 302 are moved to encircle airfoil 105 and coating mask securing inserts 330 on each respective radial mask strip 303 can be aligned (but no insertion part 350 of coating mask securing inserts 330 are inserted into cooling holes 200) with cooling holes 200. Next, a last terminal radial mask strip 303 associated with end 322 can be aligned with a column of cooling holes 200 and insertion part 350 of respective coating mask securing inserts 330 on that end 322 are inserted into cooling holes 200. Then once the first initial and last terminal radial mask strips 303 are frictionally secured into corresponding cooling holes 200, the remainder of insertion part 350 of coating mask securing inserts 330 can then be inserted into cooling holes 200.

As can be discerned from the instant description of the embodiments, the conforming coating mask 300, self-biasing anchors 301, 302, and radial mask strips 303 with individual mask geometries sized and shaped to cover a cooling hole 200 prevent clogging cooling holes 200 with coating. Thus, the overall configuration prevents bridging of coating between the component surface and edge of the conforming coating mask 300.

As can be also be discerned from the description of the embodiments, the features of conforming coating mask 300 and its use on a blade 100 provide a method of masking a turbine component to block any holes in the turbine component during post formation coating processing. The method comprises contemporaneously forming, via additive manufacturing, the conforming coating mask 300 and the turbine blade 100. After formation, conforming coating mask 300 is positioned overlying blade 100 so at least one closure plug overlies at least one corresponding cooling hole 200. A force is applied to one or more coating mask securing inserts 330 or radial mask strips 303, thus moving at least one but preferably all of insertion parts 350 into a corresponding cooling hole 200.

Coating (or other post formation processing) can occur and coating is prevented from entering cooling holes 200 on blade 100 by plugs coating mask securing inserts 330. Moreover, even where coating mask securing inserts 330 are not provided or inserted into cooling holes 200, coating may be prevented from entering cooling holes 200 as at least one radial mask strip 303 overlies in close proximity columns of cooling holes 200. Each radial mask strip 303 will mask a column of cooling holes 200. Accordingly, not every cooling hole 200 may require a corresponding coating mask securing insert 330 and masking may still be achieved. In other words, coating mask securing inserts 330 serve to align and secure the mask strip 303 in place in the event one of the anchors 301, 302 breaks. The embodiments herein do not require insertion parts 350 and coating mask securing inserts 330 for every cooling hole but a mask strip 303 over every cooling hole 200 will prevent coating therein.

Once any post formation processing is complete, conforming coating mask 300 can be removed by lifting on any part of conforming coating mask 300, such as but not limited to anchors 301, 302, a radial mask strip 303 or any coating mask securing inserts coating mask securing inserts 330.

Another aspect of the disclosure provides a method of masking a turbine component to block any holes in the turbine component during post formation processing. The method includes forming via additive manufacturing a conforming coating mask contemporaneously with forming via additive manufacturing the turbine component. Forming the conforming coating mask includes integrally forming, via additive manufacturing: includes at least two anchors; a plurality of radial mask strips integrally formed with and extending between each of the at least two anchors; and at least one coating mask securing insert. Each at least one coating mask securing insert integrally formed with a respective at least one radial mask strip; wherein the plurality of radial mask strips align with and cover the plurality of cooling holes.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise. "Approximately" as applied to a particular value of a range applies to both end values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A conforming coating mask for use with a turbine component having a plurality of cooling holes, the conforming coating mask comprising:
    at least two anchors;
    a plurality of radial mask strips integrally formed with and extending between each of the at least two anchors; and
    at least one coating mask securing insert, each at least one coating mask securing insert integrally formed with a respective at least one radial mask strip;
    wherein the plurality of radial mask strips align with and cover the plurality of cooling holes.

2. A conforming coating mask according to claim 1, wherein the at least two anchors, the plurality of radial mask strips, and the at least one coating mask securing insert are integrally formed by additive manufacturing.

3. A conforming coating mask according to claim 1, wherein each at least one coating mask securing insert includes:
    a plug cap; and
    an insertion part enterable into at least one cooling hole.

4. A conforming coating mask according to claim 3, wherein the insertion part frictionally engages a wall of the at least one cooling hole.

5. A conforming coating mask according to claim 3, wherein the insertion part includes a sinusoidal portion.

6. A conforming coating mask according to claim 3, wherein the insertion part includes an elongated spiral portion.

7. A conforming coating mask according to claim 3, wherein the insertion part includes a compressible portion including a plurality of compressible legs integrally formed with the plug cap, the plurality of compressible legs separated from each other by a gap, the plurality of compressible legs movable into the gap by a force on the plurality of compressible legs, wherein once the force is removed the plurality of compressible legs return from the gap.

8. A conforming coating mask according to claim 7, wherein the plurality of compressible legs includes only two compressible legs.

9. A conforming coating mask according to claim 7, wherein the gap is triangular in cross-sectional shape.

10. A conforming coating mask according to claim 3, wherein the plug cap includes a raised top portion and has an elliptical periphery.

11. A conforming coating mask according to claim 3, wherein the plug cap includes a raised top portion and has a circular periphery.

12. A conforming coating mask according to claim 3, wherein the bottom surface of the plug cap includes a depression.

13. A system comprising: a turbine component and a conforming coating mask contemporaneously formed with the component;
the turbine component including an airfoil and a plurality of cooling holes therein;
the conforming coating mask including:
at least two anchors;
a plurality of radial mask strips integrally formed and extending between each of the at least two anchors; and
at least one coating mask securing insert integrally formed with a respective one of the at least one radial mask strip;
wherein the plurality of radial mask strips align with and cover the plurality of cooling holes.

14. A system according to claim 13, wherein the turbine component is a blade.

15. A system according to claim 13, wherein the at least two anchors, the at least one radial mask strip, and the at least one coating mask securing insert are integrally formed by additive manufacturing.

16. A system according to claim 13, wherein the system including the at least two anchors disposed around the turbine component so the plurality of radial mask strips positions one of the at least one coating mask securing inserts over a corresponding cooling hole in the turbine component.

17. A system according to claim 13, wherein the each at least one coating mask securing insert includes a plug cap; and an insertion part enterable not at least one cooling hole.

18. A system according to claim 17, wherein the plug cap includes a raised top portion and has a periphery extending over a full periphery of a respective cooling hole.

19. A system according to claim 17, wherein the insertion part enterable not at least one cooling hole includes at least one of: a plurality of legs integrally formed with the plug cap that extend from a bottom surface of the plug cap to frictionally engage a wall of a cooling hole; a sinusoidal portion; and an elongated spiral portion.

20. A system according to claim 17, wherein the bottom surface of the plug cap includes a depression therein.

* * * * *